(12) United States Patent
Wang et al.

(10) Patent No.: US 11,664,062 B2
(45) Date of Patent: May 30, 2023

(54) MEMORY CALIBRATION SYSTEM AND METHOD

(71) Applicant: Advanced Micro Devices, Inc., Santa Clara, CA (US)

(72) Inventors: Jing Wang, Austin, TX (US); Kedarnath Balakrishnan, Bangalore (IN); Kevin M. Brandl, Austin, TX (US); James R. Magro, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 30 days.

(21) Appl. No.: 16/938,855

(22) Filed: Jul. 24, 2020

(65) Prior Publication Data
US 2022/0028450 A1 Jan. 27, 2022

(51) Int. Cl.
| *G06F 9/00* | (2006.01) |
| *G11C 11/406* | (2006.01) |
| *G06F 9/4401* | (2018.01) |
| *G06F 1/3203* | (2019.01) |

(52) U.S. Cl.
CPC ...... *G11C 11/40611* (2013.01); *G06F 1/3203* (2013.01); *G06F 9/442* (2013.01); *G11C 11/40615* (2013.01); *G06F 9/4401* (2013.01)

(58) Field of Classification Search
CPC .. G06F 11/40611; G06F 1/3203; G06F 9/442; G06F 11/40615
See application file for complete search history.

(56) References Cited

U.S. PATENT DOCUMENTS

| 5,668,551 | A * | 9/1997 | Garavan | H03M 1/1009 |
| | | | | 341/172 |
| 6,230,274 | B1 * | 5/2001 | Stevens | G06F 11/1441 |
| | | | | 710/10 |
| 6,473,607 | B1 * | 10/2002 | Shohara | H04W 52/0293 |
| | | | | 455/208 |
| 9,510,289 | B1 * | 11/2016 | de Ruijter | H03L 7/148 |
| 10,083,736 | B1 * | 9/2018 | Jeter | G11C 11/4091 |
| 10,172,092 | B1 * | 1/2019 | Zhou | G06F 1/08 |
| 10,218,363 | B1 * | 2/2019 | Kavousian | G06F 1/32 |
| 10,347,306 | B2 | 7/2019 | Chang et al. | |

(Continued)

FOREIGN PATENT DOCUMENTS

KR   10-2018-0000281 A   1/2018

*Primary Examiner* — Volvick Derose
(74) *Attorney, Agent, or Firm* — Volpe Koenig

(57) ABSTRACT

A method for performing stutter of dynamic random access memory (DRAM) where a system on a chip (SOC) initiates bursts of requests to the DRAM to fill buffers to allow the DRAM to self-refresh is disclosed. The method includes issuing, by a system management unit (SMU), a ForceZQCal command to the memory controller to initiate the stutter procedure in response to receiving a timeout request, such as an SMU ZQCal timeout request, periodically issuing a power platform threshold (PPT) request, by the SMU, to the memory controller, and sending a ForceZQCal command prior to a PPT request to ensure re-training occurs after ZQ Calibration. The ForceZQCal command issued prior to PPT request may reduce the latency of the stutter. The method may further include issuing a ForceZQCal command prior to each periodic re-training.

18 Claims, 8 Drawing Sheets

(56) References Cited

U.S. PATENT DOCUMENTS

| | | | |
|---|---|---|---|
| 2006/0104137 A1* | 5/2006 | Bellows | G11C 11/4072 365/222 |
| 2006/0176040 A1* | 8/2006 | Kernahan | G06F 1/3203 323/299 |
| 2007/0152876 A1* | 7/2007 | Wang | G01S 19/26 342/357.65 |
| 2008/0222483 A1* | 9/2008 | Ito | G06F 11/106 714/754 |
| 2010/0277764 A1* | 11/2010 | Yamazaki | G03G 15/5066 358/1.15 |
| 2011/0066798 A1* | 3/2011 | Kaiwa | G11C 11/4093 711/E12.001 |
| 2011/0197043 A1* | 8/2011 | Lin | G06F 1/3287 711/E12.091 |
| 2012/0300570 A1 | 11/2012 | Kim et al. | |
| 2013/0293260 A1* | 11/2013 | Shiah | H03K 19/0005 326/30 |
| 2014/0003178 A1* | 1/2014 | Song | G11C 11/40611 365/222 |
| 2014/0019792 A1* | 1/2014 | Oh | G11C 29/028 713/501 |
| 2014/0089707 A1* | 3/2014 | Jouin | G06F 1/3243 713/323 |
| 2016/0034219 A1* | 2/2016 | Jeter | G06F 3/0683 711/154 |
| 2016/0048334 A1* | 2/2016 | Jeter | G11C 29/028 711/163 |
| 2017/0300338 A1* | 10/2017 | Cadigan | G06F 9/4403 |
| 2017/0345483 A1* | 11/2017 | Wang | G11C 7/1072 |
| 2018/0074743 A1* | 3/2018 | Jeter | G06F 3/0653 |
| 2019/0138234 A1 | 5/2019 | Brandl et al. | |
| 2019/0385670 A1* | 12/2019 | Notani | G11C 29/50008 |
| 2019/0392886 A1 | 12/2019 | Cox et al. | |
| 2020/0285406 A1* | 9/2020 | Notani | G11C 11/4074 |

\* cited by examiner

MEMORY CALIBRATION SYSTEM AND METHOD

BACKGROUND

Dynamic random-access memory (DRAM) is a commonly used type of memory used in a computer system. DRAM is a volatile memory that requires proper initialization and periodic calibration in order to maintain performance including proper interface impedances for interface performance.

BRIEF DESCRIPTION OF THE DRAWINGS

A more detailed understanding can be had from the following description, given by way of example in conjunction with the accompanying drawings wherein.

DETAILED DESCRIPTION

In order to perform periodic calibration to maintain proper performance of a dynamic random-access memory (DRAM), the following methods and systems are provided.

A system and method for a state machine for power down, auto-refresh, and ZQCal (SPAZ) for periodic calibration to maintain proper performance of DRAM are disclosed. The system and method include a power down logic (PD), an automatic refresh logic (REF) which includes per-bank refresh, a ZQ state machine (ZQ) for calibration, and a thermal logic (THM) for monitoring thermal conditions. The SPAZ links to a back end queue (BEQ) and arbiter (ARB), wherein the arbiter and SPAZ check if a ZQ interval counter expires during memory controller control of the memory, waiting until arbiter gets control of the memory before sending out a ZQCal Start command, sending a ZQCal Latch from the SPAZ/arbiter when the tZQCAL counter expires, and on a condition that a Self-Refresh State Machine (SRSM) is to control, handing control over to the SRSM after the ZQCal latch is complete.

A method for performing stutter of a DRAM where a system on a chip (SOC) initiates bursts of requests to the DRAM to fill buffers to allow the DRAM to self-refresh is disclosed. The method includes issuing, by a system management unit (SMU), a ForceZQCal command to the memory controller to initiate the stutter procedure in response to receiving a timeout request, such as an SMU ZQCal timeout request, periodically issuing a power platform threshold (PPT) request, by the SMU, to the memory controller, and sending a ForceZQCal command prior to a PPT request to ensure re-training occurs after ZQ Calibration. The ForceZQCal command issued prior to PPT request may reduce the latency of the stutter. The method may further include issuing a ForceZQCal command prior to each periodic re-training.

A method for initiating a ZQCal cycle supported by the SPAZ to all ranks across a plurality of groups is disclosed. The method includes setting the ForceZQCal bit by an SMU, initiating ZQ start, and upon receiving a ForceZQCal start, resetting a SPAZ counter to start counting from 0. The SMU setting the ForceZQCal bit allows the SMU to control the ZQCal cycle. The SPAZ may initiate the ZQStart. A latch may be considered atomic upon ZQ start. If the ForceZQCal occurs while the SPAZ procedure is in progress, ceasing ZQ commands for a group in the plurality of groups where the in-progress procedure is a hardware initiated ZQStart/Latch. The method further includes sending ZQ commands sent by the SPAZ to the remaining groups.

Figure 1:
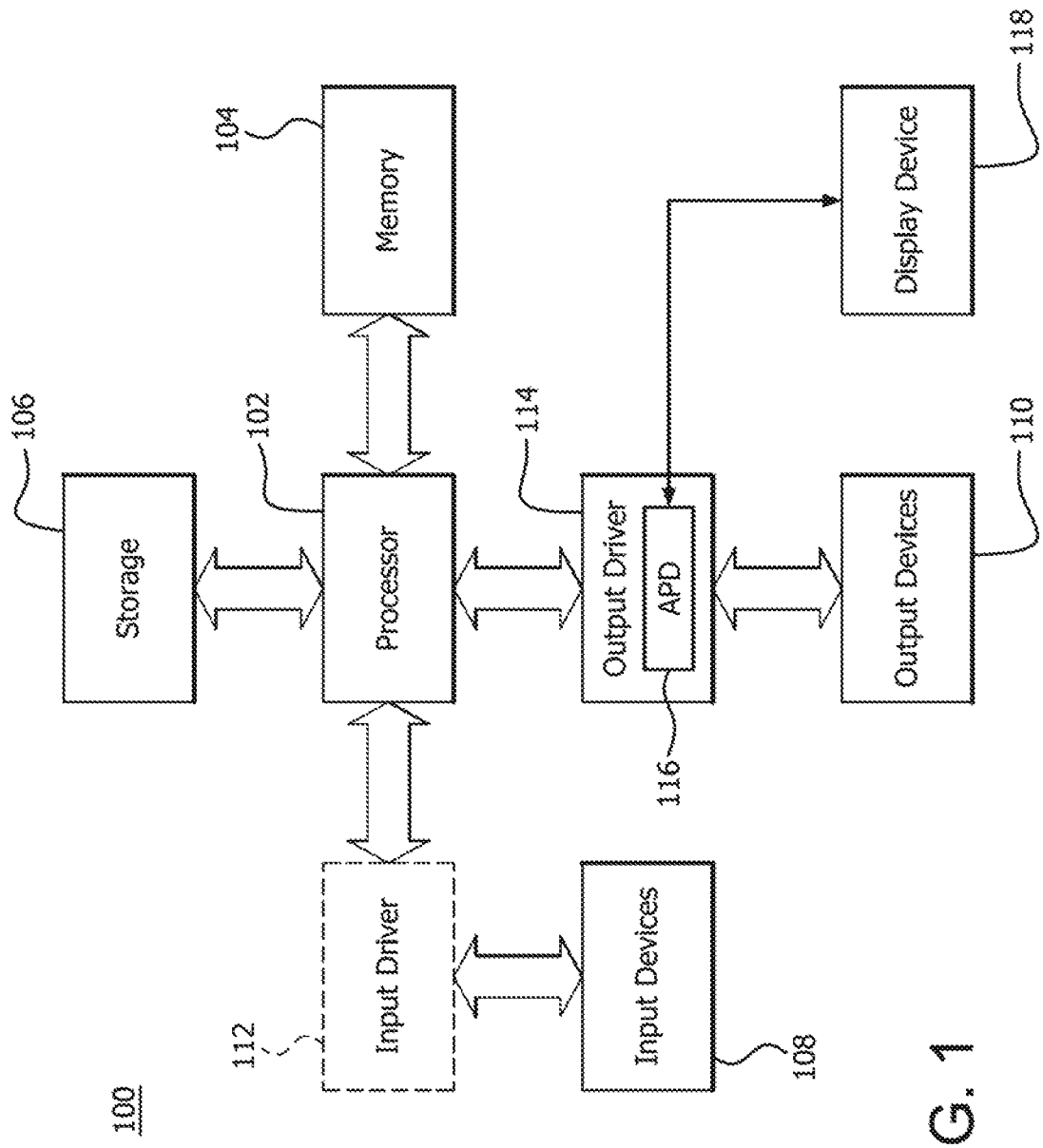
FIG. 1 is a block diagram of an example device in which one or more features of the disclosure can be implemented.

FIG. 1 is a block diagram of an example device 100 in which one or more features of the disclosure can be implemented. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. DRAM is a type of random access semiconductor memory that stores each bit of data in a memory cell consisting of a tiny capacitor and a transistor, both typically based on metal-oxide-semiconductor (MOS) technology. The capacitor can either be charged or discharged to represent the two values of a bit, conventionally called 0 and 1. The electric charge on the capacitors slowly leaks off, so without intervention the data on the chip would soon be lost.

To prevent this, DRAM requires an external memory refresh circuit which periodically rewrites the data in the capacitors, restoring them to their original charge. This refresh process is the defining characteristic of dynamic random-access memory, in contrast to static random-access memory (SRAM) which does not require data to be refreshed.

DRAM typically takes the form of an integrated circuit chip, which can include dozens to billions of DRAM memory cells. DRAM chips are widely used in digital electronics where low-cost and high-capacity computer memory is required. One of the largest applications for DRAM is the main memory (colloquially called the "RAM") in modern computers and graphics cards (where the "main memory" is called the graphics memory). It is also used in many portable devices and video game consoles.

Generally, there are four steps to prepare a DRAM for use in a computer system. These include power-up and initialization, ZQ calibration, Vref DQ calibration, and read/write training as is described below.

Power-up and initialization is a well-defined sequence of steps including applying power to the DRAM. At this point, the DRAMs on the dual in-line memory module (DIMM) operate at a set frequency, have defined the Column Access Strobe (CAS) Latency (CL), CAS Write Latency (CWL) and other timing parameters.

ZQ Calibration for Double Data Rate Synchronous Random-Access Memory (DDR4), a type of DRAM, for example, is related to the data pins and a set of parallel resistor legs. In one example, these resistor legs are 240Ω, although other resistance values may be utilized. Because of the nature of complementary metal-oxide-semiconductor (CMOS) devices, these resistors are never exactly the desired resistance, such as the 240Ω in the example. The resistance is affected due to voltage and temperature changes among other factors. In order to tune these resistors to exactly or substantially the desired value, such as 240Ω in the example, each DRAM has a special block called a DQ calibration control block and a ZQ pin to which a resistor is connected. This external precision resistor is the "reference" and it remains at the desired value, such as the 240Ω value in the example, at all temperatures. When a ZQCal command is issued during initialization, this DQ calibration control block gets enabled and it produces a tuning value. This tuning value is then copied over to each DQ's internal circuitry.

In DDR4, an internal voltage reference is used to determine if the signal on data lines is 0 or 1. This voltage reference is called VrefDQ. The VrefDQ can be set using mode registers and it needs to be set correctly by the memory controller during the VrefDQ calibration phase.

Once these power-up and initialization steps are performed, the system is in IDLE mode and operational. An additional requirement for use of DRAM may include periodic calibration.

Low-Power Double Data Rate Synchronous Dynamic Access Memory (LPDDR4) devices require periodic ZQ Calibration (impedance) to compensate for voltage and temperature impedance drift, as set forth above. LPDDR4 devices, like other DDR4 devices, support specific commands to start device calibration. However, LPDDR4 devices support separate commands to start a calibration and actually perform the impedance update based on that calibration. A ZQStart command informs the device to do a calibration and a ZQLatch informs the device to apply the value from the calibration.

In the present embodiment of LPDDR4, two 16-bit devices may be grouped together as one 32-bit LPDDR4 channel as the memory controller channel minimum LPDDR4 resolution is 32-bits. ZQ calibration is performed by two ranks being supported per channel and each rank has its own calibration resistors. The physical interface (PHY) issues the ZQCal command to the memory controller before re-training, which is performed by the PHY when exiting out of a PHY power gated scenario when the MstateCtrl.ConvertD2toPHYLP3 bit is set, with both ranks per sub-channel to be ZQ calibrated simultaneously. The memory controller issues ZQCal commands to each rank independently. Two independent channels may be supported with one memory controller channel when in Virtual Controller Mode (VCM) with each 32-bit sub channel ZQ calibrating independently, although ZQ calibration may still be performed simultaneously. VCM occurs when one DRAM controller runs two separate independent channels to satisfy the need for two separate DRAM controllers. Per the device specification, LPDDR4 devices cannot be sent ZQStart or ZQLatch commands when the devices are in power down mode. However, the LPDDR4 device power down can occur during ZQ calibration. Traffic may be sent to LPDDR4 devices between ZQStart and ZQLatch with a minimum 1 μs delay between ZQStart and ZQLatch.

The SPAZ logic may support a ZQ calibration interval timer. The interval is configurable from between 32 ms-256 ms, for example, and is specified as Tzq (ZqCsInterval). With multiple ranks, the Tzq interval can be set to one-half, for example. The interval counter exists in an always on (AON) region so the counting is not affected by power gating. Each ZQ command is sent when the command bus is available, i.e., transactions in-flight may be allowed to complete before ZQStart calibration is sent out. Once SPAZ sends a ZQStart, a ZQLatch may atomically be sent before giving control back to the memory controller. ZQ Calibration and the corresponding update are performed during periodic update during mission mode, stutter and S3 sleep states as discussed below.

SPAZ includes a ZQ interval timer that needs to be in an AON region. The ZQ interval is broken into two groups per x32 sub-channel. The SPAZ may send commands to each group based on the interval, such as (ZQ Interval)/2, for example.

Figure 2:
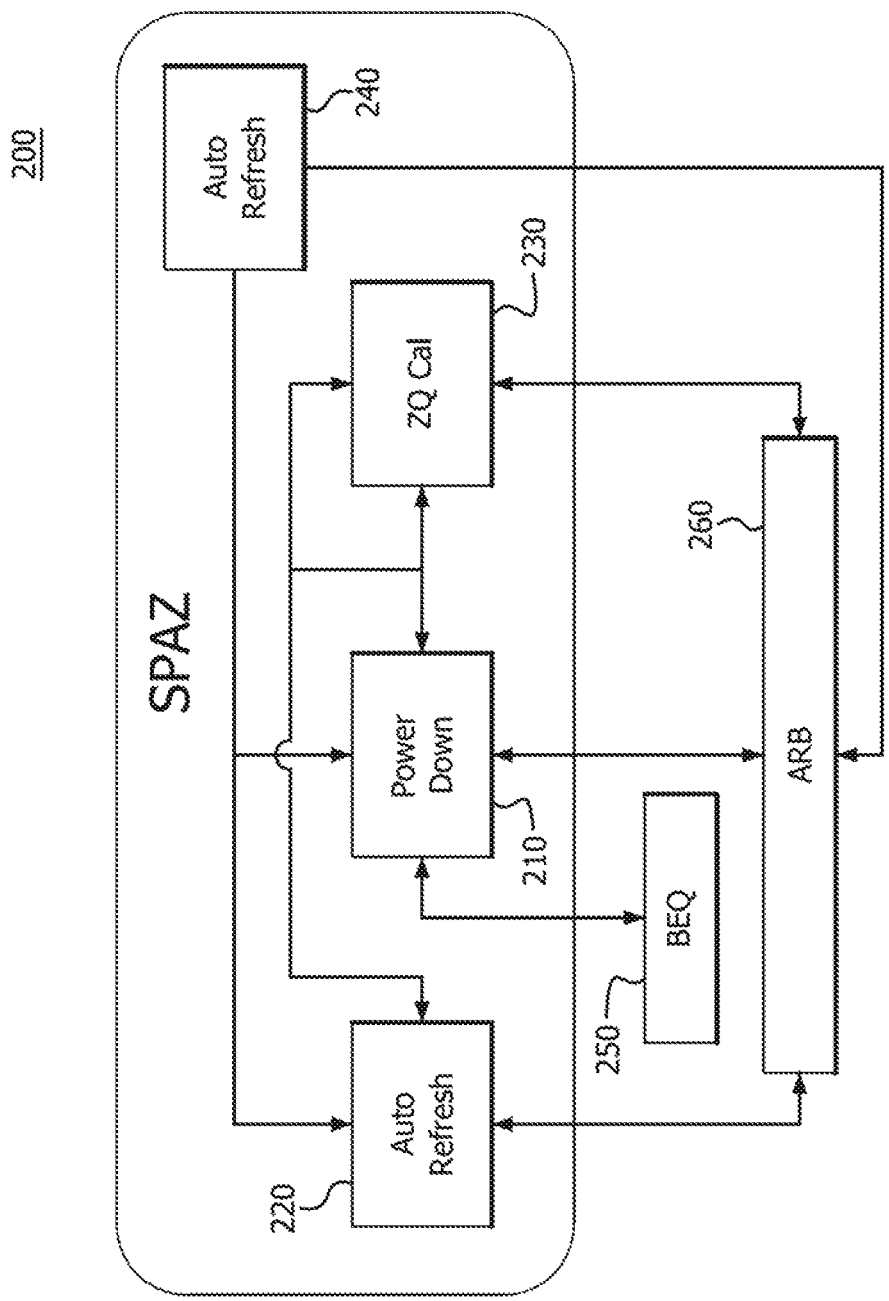
FIG. 2 illustrates a state machine for power down, auto-refresh, ZQCal (SPAZ)

FIG. 2 illustrates a state machine for power down, auto-refresh, ZQcal (SPAZ) 200 for the DRAM. SPAZ 200 includes power down logic (PD) 210, automatic refresh logic (REF) 220, which may include per-bank refresh capability, a ZQ state machine (ZQ) 230 for calibration, and thermal logic (THM) 240. SPAZ 200 may also include links to a back end queue (BEQ) 250 and an arbiter (ARB) 260.

Power down logic 210 enables the memory controller to support full channel power down and partial channel power down. Partial channel power down occurs when some of the ranks are put into power down mode. Full channel power down occurs when all of the ranks are put into power down mode. Power down logic 210 communicates with arbiter 260 to monitor bus/rank status and to determine whether any, and which, rank can be put into power down. Aggressive power down may also be performed in order to save passive waiting time for pages to be closed. Power down logic 210 may enable power down channel staggering to prevent all channels from entering or exiting power down simultaneously for power down logic channel staggering, where appropriate.

Automatic refresh logic 220 enables the memory controller to periodically refresh the DRAMs with the auto-refresh commands. Automatic refresh logic 220 may be limited, such as by only allowing selecting a single rank, one bank, or multiple banks, at a time, for example. Fine granularity automatic refresh may be included with automatic refresh logic 220 and may be utilized for DDR4 memory products. Automatic refresh logic 220 may include logic that tracks when a refresh is needed and may send refresh command requests to arbiter 260 for subsequent transmission to the DRAM based on the tracking. Automatic refresh logic 220 may enable per bank refresh as supported in DRAM technologies where it is permitted, such as LPDDR4/HBM, for example.

ZQ 230 may be used to calibrate the DRAM and on-die termination (ODT) values. As is understood by those possessing an ordinary skill in the pertinent arts, DRAMs often require a longer time (ZQCL) to calibrate output driver and ODT circuits at initialization and when attempting to exit self-refresh and a relatively smaller time (ZQCS) to perform periodic calibrations to account for voltage and temperature variations. ZQ 230 may handle the generation of ZQCS calibration commands. Memory controller may send a long version (ZQCL) ZQ command during initialization and while coming out of self-refresh and a short version (ZQCS) ZQ command to perform periodic calibrations. SPAZ 200 supports ZQCS, while ZQCL may be supported by the PHY/memory controller during initialization or self-refresh exit.

Thermal logic 240 monitors temperature ports from the board in some products and may capture results from periodic mode register reads to monitor the DRAM thermal status. Thermal logic 240 may take actions based on these inputs including dynamically changing the refresh rate by either increasing or decreasing the rate, throttling commands by capping the bandwidth on the DRAM interface, de-rating command separation timings, putting ranks into power down and logging a machine check memory temperature hot (MCA) error.

Back end queue 250 manages the address, data and control signaling out to the channel bound for the physical layer (PHY). Back end queue 250 may manage the write data movement into the channel from the write data buffer and may move read data responses back to the front end interface (FEI).

As illustrated, power down logic 210 may receive input from thermal logic 240, automatic refresh logic 220, ZQ 230, back end queue 250, and arbiter 260 and may output to ZQ 230, automatic refresh logic 220, back end queue 250, and arbiter 260. ZQ 230 communicates with automatic refresh logic 220, power down logic 210, and arbiter 260. Thermal logic 240 outputs to automatic refresh logic 220, power down logic 210, and arbiter 260. For completeness, automatic refresh logic 220 communicates with arbiter 260, thermal logic 240, power down logic 210 and ZQ 230. Back end queue 250 communicates with power down logic 210. Arbiter 260 communicates with automatic refresh logic 220, thermal logic 240, ZQ 230 and power down logic 210.

During ZQCS, the DDR bus may be idle while the DRAMs perform ZQ calibration. Some systems may have shared ZQ resistors between devices causing calibration commands to some ranks to be independently sent. For example, two ranks in a Digital Dynamics Processor (DDP) perform ZQCS at different times. By way of further example, all ranks in a Three Dimensional Dual-Screens (3DS) package can get ZQ calibration done with one command. Periodic calibration is done using a long counter that counts to a configurable interval (e.g., with ¼ of the interval), selecting one ZQ group, and if the selected group is configured with populated ranks, a ZQCS sequence may be started.

Figure 3:
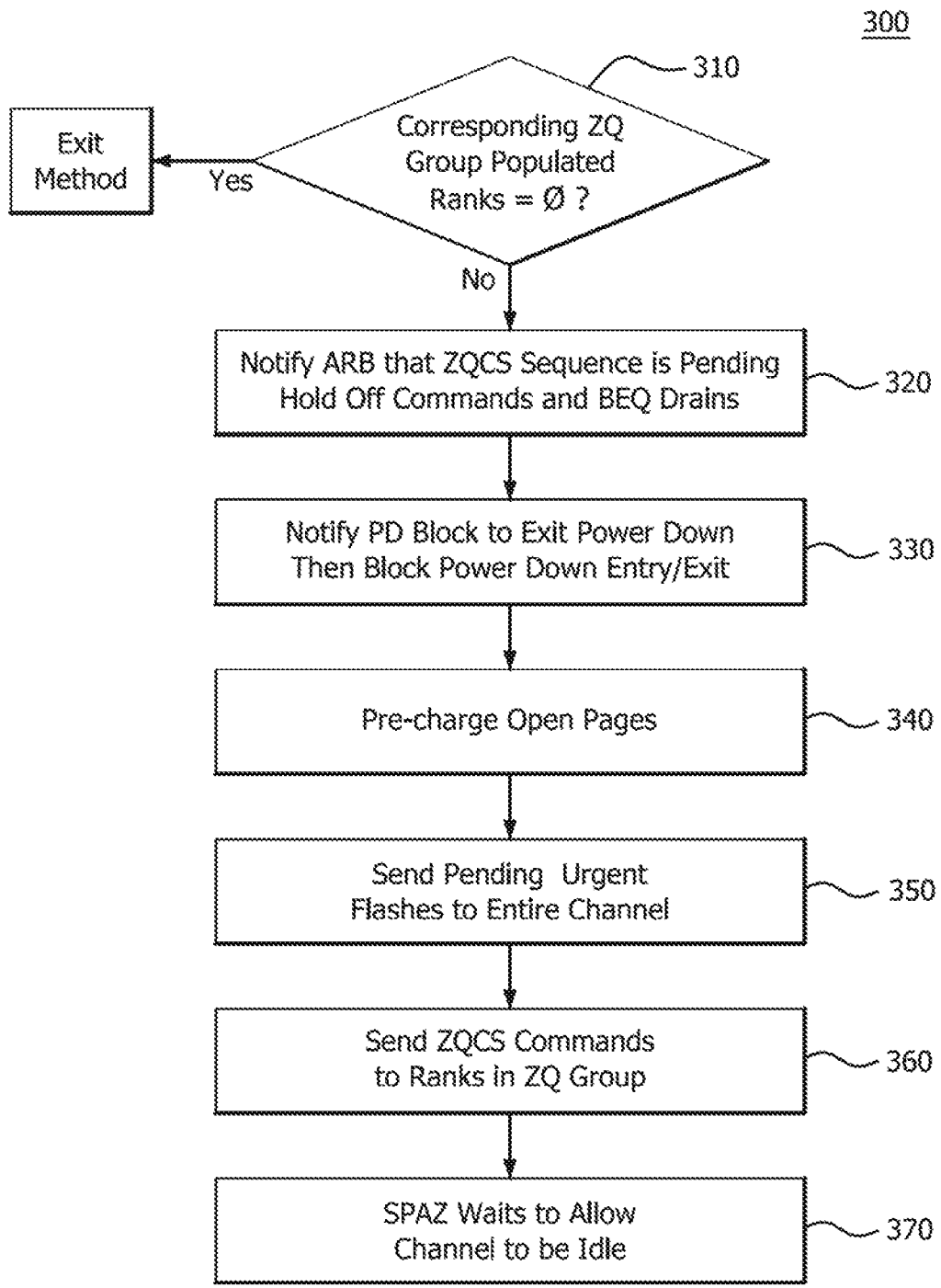
FIG. 3 illustrates a method for a ZQCS sequence performed in the SPAZ of FIG. 2.

FIG. 3 illustrates a method 300 for performing a ZQCS sequence performed in SPAZ 200. Method 300 includes, at step 310, if the corresponding ZQ group has no populated ranks, skip method 300. At step 320, there is a notification of the arbiter (element 260 in FIG. 2) and other SPAZ (element 200 in FIG. 2) blocks that a ZQCS sequence is pending, holding off most commands based on the notification, followed by a delay to allow the back end queue (element 250 in FIG. 2) to drain. At step 330, there is a notification of the power down logic block (element 210 in FIG. 2) to exit power down state for the entire channel, and the method 300 should block any power down entry/exit while ZQCS sequence completes. At step 340, the open pages of the populated ranks in the ZQ group are precharged. At step 350, method 300 sends any pending urgent refreshes to the entire channel. Again, no other refresh commands may be sent during a ZQCS sequence. At step 360, method 300 sends ZQCS commands to the ranks in the ZQ group. At step 370, the SPAZ waits (for a Tzqcs length of time) allowing the channel to be idle during this time.

Figure 4:
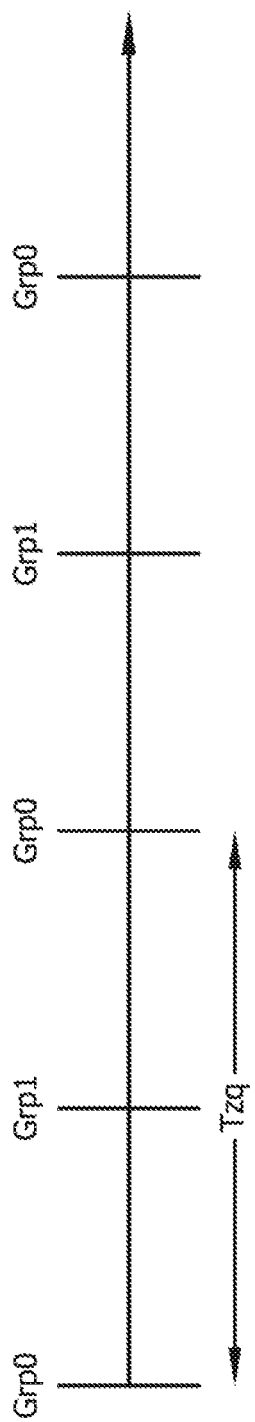
FIG. 4 illustrates two groups where each group is sent by the SPAZ for Tzq.

FIG. 4 illustrates two groups (Grp0, Grp1) where each group is sent by the SPAZ based on interval/2 for Tzq. The SPAZ (element 200 in FIG. 2) may instruct both sub-channels simultaneously for ZQStart and ZQLatch separately. SPAZ (element 200 in FIG. 2) keeps track of the start per sub-channel with a separate ZQCAL counter (1 µs) per sub-channel. The arbiter (element 260 in FIG. 2) may send normal traffic between ZQStart and ZQLatch commands and maintain atomicity before handing over control to the memory controller.

On S3 sleep state exit or connected standby, video and audio are expected to be disabled so encountering the additive ZQ calibration across all ranks and re-train is expected. In this configuration, since the system has been inactive for possibly a long time and the DRAM is not periodically ZQ calibrated or periodically trained during this time, the SMU signals ZQ calibration and periodic training via configuration to retrain and ZQCal before any access initiated by PHY may be needed. Generally, there is no traffic between ZQStart and ZQLatch. ZQ calibration of 'groups' back-to-back for both x32 sub-channels totals 1 µs+30 ns+1 µs+30 ns=2.06 µs. For exit from connect standby, the SMU may set a control bit, such as MstateCtrl.ConvertD2toPHYLP3, prior to entering the connect standby state so the memory controller may convert a request to awaken based on a normal C-State Request (such as a D2 request, for example) into a LP3 state so the PHY initiates a ZQCal before a retraining on exit occurs.

Exiting from S3/Connected Standby using PHY LP3 state may operate differently. The SRSM adds a bit to do an extended Cstate responsive to a D2 request in the LP3 state so the PHY is initiated (already performed for D3). This CFG bit must be set by SMU prior to the C-state request to convert a D2-LP2 to D2-LP3 to the PHY. This CFG bit is called ConvertD2toPHYLP3. This might be associated with Long Idle Vmin "Whisper" mode, for example.

Figure 5:
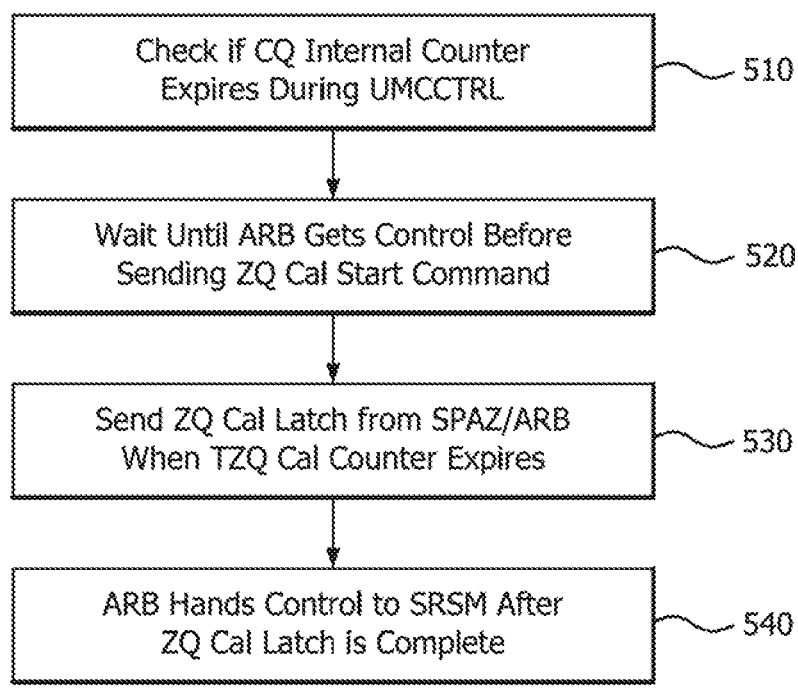
FIG. 5 illustrates a method for periodic calibration to maintain proper performance of a dynamic random-access memory (DRAM) performed by the arbiter and SPAZ of FIG. 2.

FIG. 5 illustrates a method 500 for periodic calibration to maintain proper performance of the DRAM performed by the arbiter and the SPAZ of FIG. 2. The arbiter and the SPAZ perform the method 500 of FIG. 5 for the periodic atomic calibration. Method 500 includes checking if the ZQ interval counter expires during memory controller control of the memory at step 510 and then waiting until the arbiter gets control before sending out the ZQCal Start (ZQStart) command at step 520. Method 500 includes sending ZQCal Latch (ZQLatch) from the SPAZ/arbiter at step 530 when the tZQCAL counter expires. The arbiter returns control to the SRSM after the ZQCal Latch procedure is performed at step 540.

In general, embodiments of the invention enable initiating the process of a ZQ calibration before an entering an event (e.g., entering a low power mode, entering self-refresh, etc.) to avoid sending ZQ calibration during exiting of the event. After exiting the event (e.g., existing a lower power mode; exiting self refresh mode), embodiments of the invention will perform calibration that was initiated before entering the event (i.e., calibration actually occurs after the event but the calibration process was initiated before the event). Initiating the ZQ calibration prior to entering an event can result in reduced costs for entering an event (e.g., a reduced cost to enter into a low or lower power mode; i.e., improved power management). Additionally, initiating the ZQ calibration prior to entering an event can also reduce bus utilization after exiting the event (e.g., lower bus utilization after exiting a lower power mode or exiting self-refresh mode). The result of either or both of these benefits may result in a system (e.g., an SoC, an SoC in combination with off-die memory, etc.) entering a lower power mode more frequently thus reducing power consumption (and improving power management) for the entire system.

Figure 6:
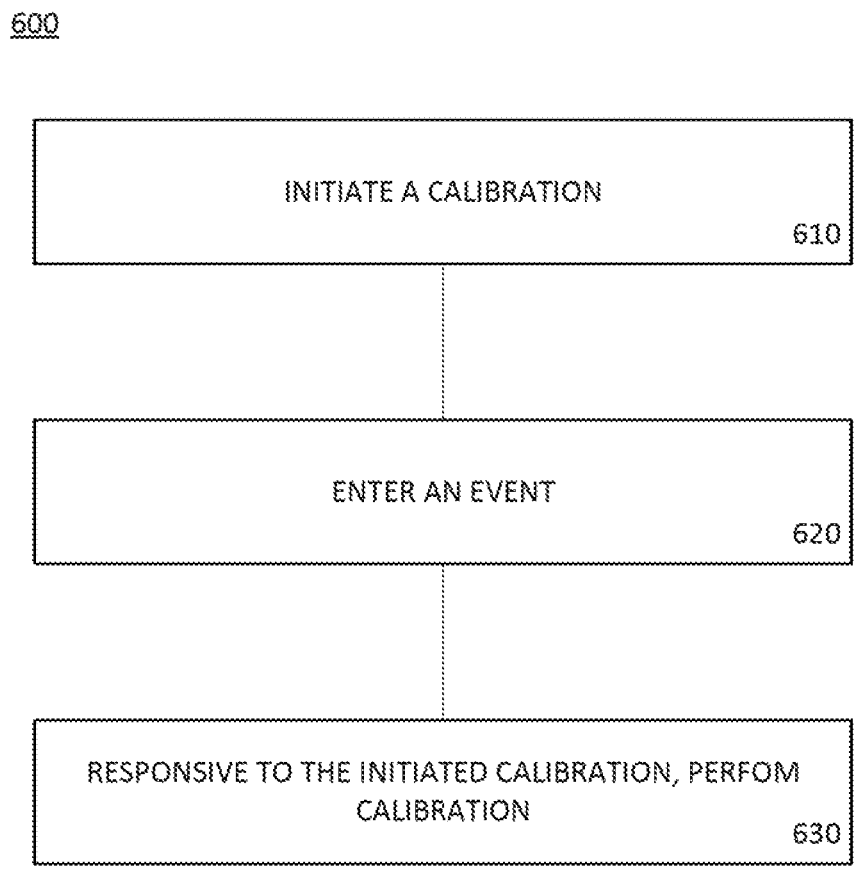
FIG. 6 illustrates a method of performing power management of a system.

FIG. 6 illustrates a method 600 of performing power management of a system. Method 600 includes initiating a calibration at step 610. In an embodiment, such an initiation may occur prior to entering an event. Method 600 may include entering the event at step 620. The event may include a lower power mode, such as a self-refresh mode of a memory, for example. Method 600 may include performing a calibration at step 630. According to an embodiment, the performing a calibration at step 630 may be responsive to the initiated calibration in step 610. Performing a calibration at step 630 may, according to an embodiment, be performed upon exiting an event.

According to an embodiment, the SPAZ can incorporate counters to track activity. These counters include a first counter (Tzq) to monitor the calibration period and a second counter (Tzqcal) to monitor the duration between ZQStart and ZQLatch (approximately 1 μs). These counters may be located in the SPAZ, such as in a subblock ZQCTR, for example. The ZQCTR may be located in the AON region, for example. The SPAZ may detect when a ZQStart command is sent out and then start the Tzqcal counter. The SPAZ then finishes off the ZQ sequence by sending the ZQLatch command.

Stutter is a process that allows an SOC to essentially initiate bursts of requests to the DRAM to fill buffers and then put the DRAM into self-refresh. The SMU keeps a counter based on a periodic cycle that matches the memory controller's periodic ZQCal timer. Upon a SMU's ZQCal timeout request, the SMU issues a ForceZQCal request to the memory controller prior to a stutter. Periodically during stutter, the SMU issues a PPT request to the memory controller. According to an embodiment, to ensure re-training occurs with the preceding ZQ Calibration, a ForceZQCal request is sent prior to a PPT request to reduce the latency (e.g., reduced the latency of a stutter). In one embodiment, the SMU may not implement a ZQCal timer and may provide a ForceZQCal request prior to each periodic re-train. Generally, the SMU waits 1.03 μs before sending instructions (1 μs between ZQStart and ZQLatch command and 30 ns actual latch overhead). Stutter is a periodic D2 process.

The SPAZ supports a method to initiate a ZQCal cycle to all ranks This method is performed by the SMU setting the ForceZQCal bit. This bit gives the SMU control of ZQCal cycle. The SPAZ initiates a ZQ start and latch and is considered atomic. If a ForceZQCal request occurs while the SPAZ is in progress of a hardware initiated ZQStart/Latch, then this calibration group may not have ZQ commands sent again (the SPAZ needs to send the ZQ commands to the remaining group). Upon receiving a ForceZQCal, the SPAZ counter may reset and start their count from 0.

Figure 7:
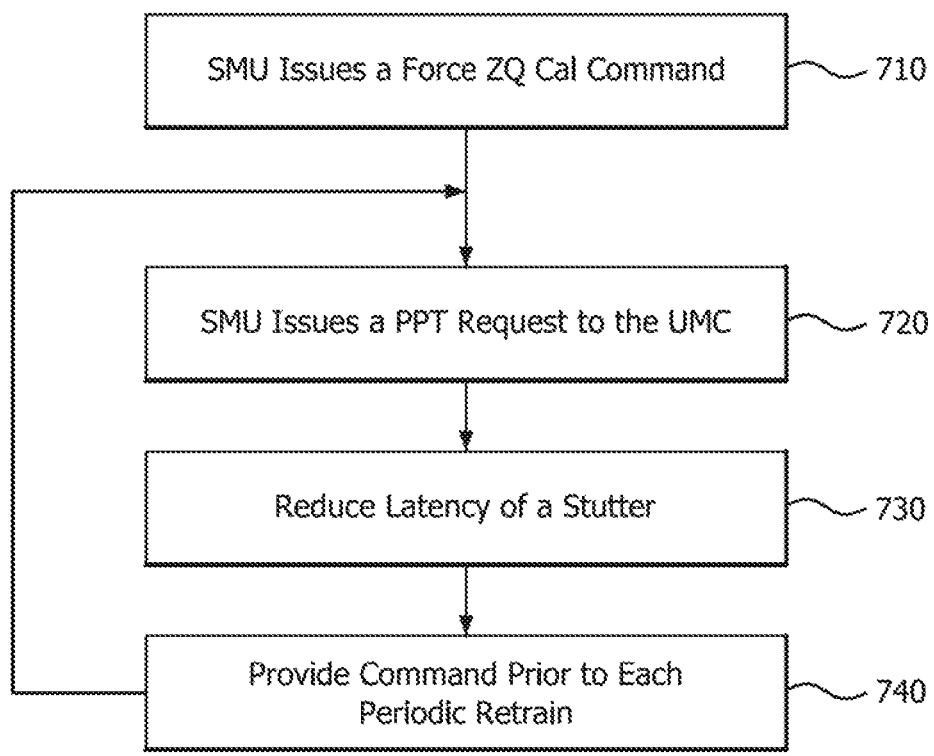
FIG. 7 illustrates a method for performing stutter.

FIG. 7 illustrates a method 700 for performing a stutter procedure. Generally, as set forth above, the SMU keeps a counter based on a periodic cycle that matches the memory controller's periodic ZQCal timer. Upon a SMU's ZQCal timeout request, at step 710 the SMU issues a ForceZQCal command to the memory controller prior to the stutter procedure. Periodically during stutter procedure, the SMU issues a PPT request to the memory controller at step 720. According to an aspect, and to ensure re-training occurs with the preceding ZQ Calibration, a ForceZQCal command is sent prior to a PPT request to reduce the latency of a stutter procedure at step 730. In one embodiment, the SMU does not implement a ZQCal timer, and instead, provides a ForceZQCal command prior to each periodic re-train at step 740.

Figure 8:
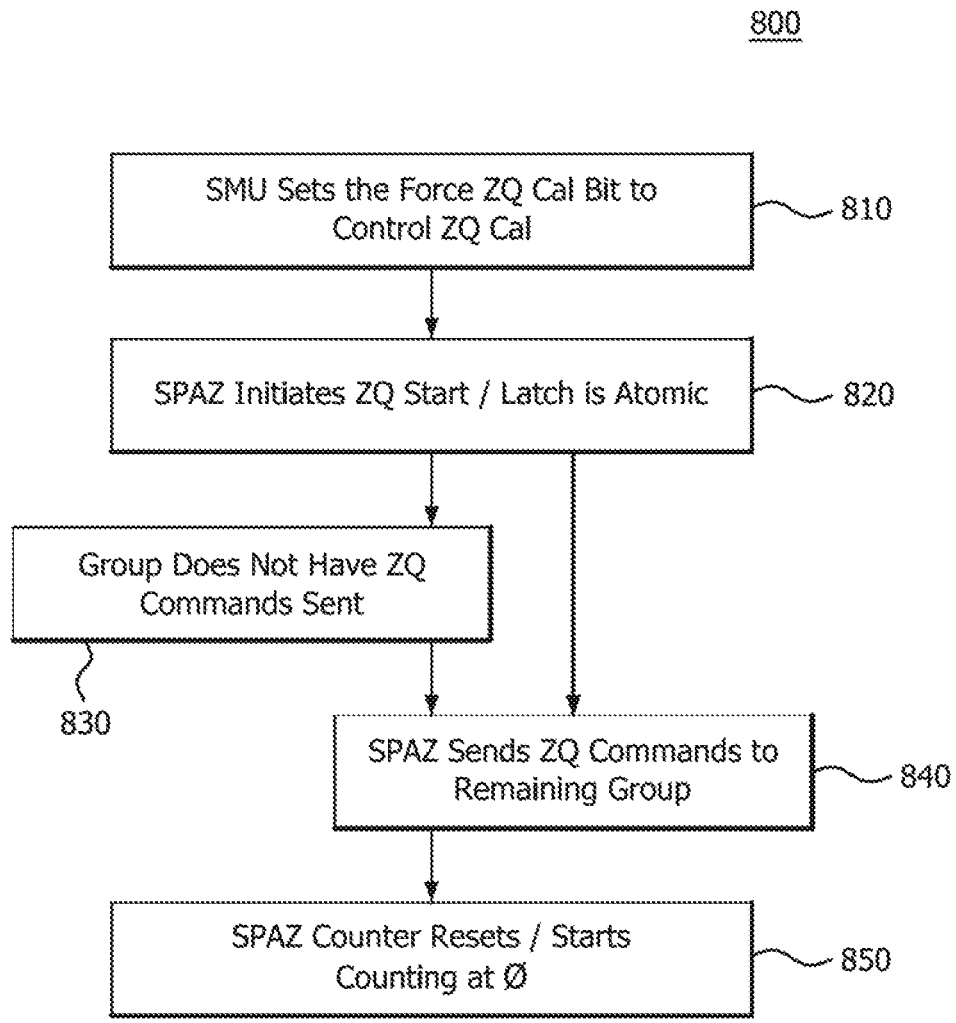
FIG. 8 illustrates a method supported by SPAZ to initiate a ZQCal cycle to all ranks.

FIG. 8 illustrates a method 800 supported by the SPAZ to initiate a ZQCal cycle to all ranks Method 800 includes, at step 810, the SMU setting the ForceZQCal bit, in order for the SMU to control the ZQ calibration. At step 820, the SPAZ initiates the ZQStart and ZQLatch and is considered atomic. If a ForceZQCal command occurs while the SPAZ is in progress of a hardware initiated ZQStart/Latch, then this calibration group may not have ZQ commands sent again at step 830 as the SPAZ may need to send the ZQ commands to the remaining group at step 840. Upon receiving a ForceZQCal command, the SPAZ counter may reset and start counting from 0 at step 850.

The SRSM uses two configuration bits with the first bit to designate sending a command to the SMU to kick-off re-training and the second bit to designate that the PHY sends ZQStart and ZQLatch commands as part of sequence: The SMU may identify to the SRSM the function to provide based on how the bits are set. The SRSM monitors the state of the two configuration bits that may be set by the SMU. If the first bit is set, a command is sent to the SMU to kick off re-training, and if the second bit is set, the SRSM sends an encoding for PPT training LP2 to the PHY.

The PHY logic is in AON domain to allow parallel exit of memory controller channel from PG along with PHY LP2 exit, etc., and logic required to issue PHY LP2 in parallel.

The presently described system and methods allows for triggering period ZQ calibration before self-refresh entry to avoid sending ZQ calibration during self-refresh exit. In the present systems and methods, ZQ calibration occurring before self-refresh entry does not block traffic during tZQCal (1 us). In each situation bus utilization is improved.

Based on time period, the SMU determines whether a ZQ calibration is necessary and SMU may specify this prior to informing the memory controller to go into self-refresh. For example, if the system is in a power state for a long time, the SMU may specify whether a ZQ calibration needs to be initiated with a periodic retrain. The SMU leaves memory controller awake for at least 2.06 us for the ZQStart and ZQLatch.

PHY may support a configuration bit written by memory controller channel to specify whether a ZQ calibration precedes a PHY re-train. This configuration bit state may be specified before both the periodic re-train and the frequency change.

It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the input driver 112, the input devices 108, the output driver 114, the output devices 110, the accelerated processing device 116, the scheduler 136, the graphics processing pipeline 134, the compute units 132, the SIMD units 138, SPAZ 200, power down logic 210, automatic refresh logic 220, ZQ 230, thermal logic 240, back end queue 250, and arbiter 260) may be implemented as a general purpose computer, a processor, or a processor core, or as a program, software, or firmware, stored in a non-transitory computer readable medium or in another medium, executable by a general purpose computer, a processor, or a processor core. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method of power management of a system comprising:
    initiating a calibration by transmitting a calibration command prior to entering an event; and
    upon exiting the event and responsive to the initiation of calibration prior to entering the event, performing calibration.
2. The method of power management of claim 1 wherein the event comprises a lower power mode.
3. The method of power management of claim 2 wherein the lower power mode comprises a self-refresh mode of a memory.
4. The method of power management of claim 1 wherein the calibration command comprises issuing a ForceZQCal command.
5. The method of power management of claim 1 wherein a System Management Unit (SMU) issues the calibration command.
6. The method of power management of claim 1 wherein the calibration command initiates a stutter procedure.
7. The method of power management of claim 1 wherein the calibration command issued prior to a request for the event reduces a latency of the stutter.
8. The method of power management of claim 1 further comprising initiating the calibration prior to each periodic re-train.
9. The method of power management of claim 1 wherein the initiating is supported by a state machine for power down, auto-refresh, ZQCal (SPAZ).
10. A method of initiating an initialization cycle, the method comprising:
    setting an initialization cycle control bit;
    initiating an initialization cycle start, the initiating comprising transmitting a calibration command prior to entering an event; and
    upon receiving an initialization cycle start command, resetting a counter to start counting.
11. The method of initiating of claim 10 wherein the initialization cycle is supported by a state machine for power down, auto-refresh, ZQCal (SPAZ).
12. The method of initiating of claim 10 wherein a system management unit (SMU) sets the initialization cycle control bit.
13. The method of initiating of claim 12 wherein the SMU setting the initialization cycle control bit allows the SMU to control the initialization cycle.
14. The method of initiating of claim 10 wherein the SPAZ initiates the initialization cycle start.
15. The method of initiating of claim 10 wherein the event comprises a lower power mode.
16. The method of initiating of claim 15 wherein the lower power mode comprises a self-refresh mode of a memory.
17. The method of initiating of claim 10 wherein if a System Management Unit (SMU) issues a calibration command, further comprising ceasing initialization commands.
18. The method of initiating of claim 17 wherein the calibration command comprises issuing a ForceZQCal command.

* * * * *